(12) United States Patent
Hirukawa et al.

(10) Patent No.: US 10,856,458 B2
(45) Date of Patent: Dec. 1, 2020

(54) SUBSTRATE TRANSFER DEVICE

(71) Applicant: FUJI CORPORATION, Chiryu (JP)

(72) Inventors: Ritsuo Hirukawa, Nishio (JP); Takeshi Kondo, Chiryu (JP); Shoji Fukakusa, Yokkaichi (JP); Mitsuaki Kato, Anjo (JP); Atsushi Torii, Toyota (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/467,303

(22) PCT Filed: Dec. 15, 2016

(86) PCT No.: PCT/JP2016/087355
§ 371 (c)(1),
(2) Date: Jun. 6, 2019

(87) PCT Pub. No.: WO2018/109891
PCT Pub. Date: Jun. 21, 2018

(65) Prior Publication Data
US 2020/0077548 A1    Mar. 5, 2020

(51) Int. Cl.
*H05K 13/00* (2006.01)
*H05K 3/34* (2006.01)
(Continued)

(52) U.S. Cl.
CPC ......... *H05K 13/0069* (2013.01); *B65G 15/12* (2013.01); *B65G 15/24* (2013.01);
(Continued)

(58) Field of Classification Search
CPC ........ B65G 15/12; B65G 15/20; B65G 15/24; H05K 3/34; H05K 13/0061; H05K 13/0069; H05K 13/02; H05K 13/04
See application file for complete search history.

(56) References Cited

U.S. PATENT DOCUMENTS 6,032,577 A * 3/2000 Doyle ................. B41F 15/0881
101/129
6,189,674 B1 * 2/2001 Izumida ................. B65G 15/10
198/341.01
(Continued)

FOREIGN PATENT DOCUMENTS

JP    2000-22398 A    1/2000
JP    2004-200587 A    7/2004
(Continued)

OTHER PUBLICATIONS

International Search Report dated Mar. 21, 2017 in PCT/JP2016/087355 filed on Dec. 15, 2016.

*Primary Examiner* — Gene O Crawford
*Assistant Examiner* — Keith R Campbell
(74) *Attorney, Agent, or Firm* — Oblon, McClelland, Maier & Neustadt, L.L.P.

(57) ABSTRACT

A first conveyor belt and second conveyor belt are disposed on guide rail which is disposed so as to extend in a circuit substrate conveyance direction. Then, the circuit substrate supported by both the conveyor belts of the first conveyor belt and the second conveyor belt is held by substrate holding device, and work is performed on the held circuit substrate. In the transfer device having such a structure, for example, when the circuit substrate on which an operation has been completed is conveyed out by the second conveyor belt, a new circuit substrate is conveyed into the transfer device by the first conveyor belt. In this way, it is possible to perform printing work on a new circuit substrate at an early stage and shorten a cycle time.

4 Claims, 10 Drawing Sheets

(51) Int. Cl.
*H05K 13/02* (2006.01)
*H05K 13/04* (2006.01)
*B65G 15/12* (2006.01)
*B65G 15/24* (2006.01)

(52) U.S. Cl.
CPC ............ *H05K 3/34* (2013.01); *H05K 13/02* (2013.01); *H05K 13/04* (2013.01)

(56) References Cited

U.S. PATENT DOCUMENTS

| | | | |
|---|---|---|---|
| 6,453,548 B1 * | 9/2002 | Hidese | H05K 13/0061 |
| | | | 198/465.1 |
| 8,523,161 B2 * | 9/2013 | Lin | H05K 13/0069 |
| | | | 269/151 |
| 8,789,265 B2 | 7/2014 | Yagi et al. | |
| 9,615,494 B2 * | 4/2017 | Nagaya | H05K 13/04 |
| 9,668,393 B2 * | 5/2017 | Kishimoto | H05K 13/0069 |
| 10,227,183 B2 * | 3/2019 | Saito | B65G 15/20 |

FOREIGN PATENT DOCUMENTS

| | | |
|---|---|---|
| JP | 2005-123655 A | 5/2005 |
| JP | 2009-54619 A | 3/2009 |

* cited by examiner

SUBSTRATE TRANSFER DEVICE

TECHNICAL FIELD

The present application relates to a substrate transfer device configured to transfer a substrate, hold the substrate at a predetermined position, and perform work on the held substrate.

BACKGROUND ART

As a transfer device, there is a device for conveying a substrate to a predetermined position and performing work on a substrate held at the position. The following Patent Literature describes an example of such a transfer device.

PATENT LITERATURE

Patent Literature 1: JP-A-2009-054619

BRIEF SUMMARY

Technical Problem

In a transfer device, shortening of a cycle time, downsizing of a device, simplification of a structure, and the like are demanded, and the practicality of a transfer device is improved by achieving them. The present disclosure has been made in view of such a circumstance, and an object of the present disclosure is to provide a highly practical transfer device.

Solution to Problem

In order to solve the above-mentioned problems, the present description discloses a substrate transfer device including: a pair of guide mechanisms disposed in a state of being spaced apart from each other so as to extend in a substrate conveyance direction; a first conveyor belt disposed on each of the pair of guide mechanisms at an upstream side in the substrate conveyance direction and configured to convey a substrate to a downstream side in the substrate conveyance direction; a second conveyor belt disposed on each of the pair of guide mechanisms at the downstream side in the substrate conveyance direction and configured to convey the substrate conveyed by the first conveyor belt further to the downstream side; and a holding device configured to hold the substrate supported by both the first conveyor belt and the second conveyor belt, in which a distance between a downstream end of the first conveyor belt and an upstream end of the second conveyor belt is shorter than a substrate length in the substrate conveyance direction, and work is performed on the substrate held by the holding device.

Advantageous Effects

In the present disclosure, it is possible to shorten a cycle time, to downsize a device, to simplify a structure, and the like in a transfer device, thereby improving the practicality of the transfer device.

BRIEF DESCRIPTION OF DRAWINGS

FIG. 8 is a schematic diagram illustrating the circuit substrate having completed printing work and the circuit substrate being newly conveyed in.

DESCRIPTION OF EMBODIMENTS

Hereinafter, as exemplary embodiments of the present disclosure, embodiments of the present disclosure will be described in detail with reference to the drawings.

(A) Configuration of Solder Printer

Figure 1:
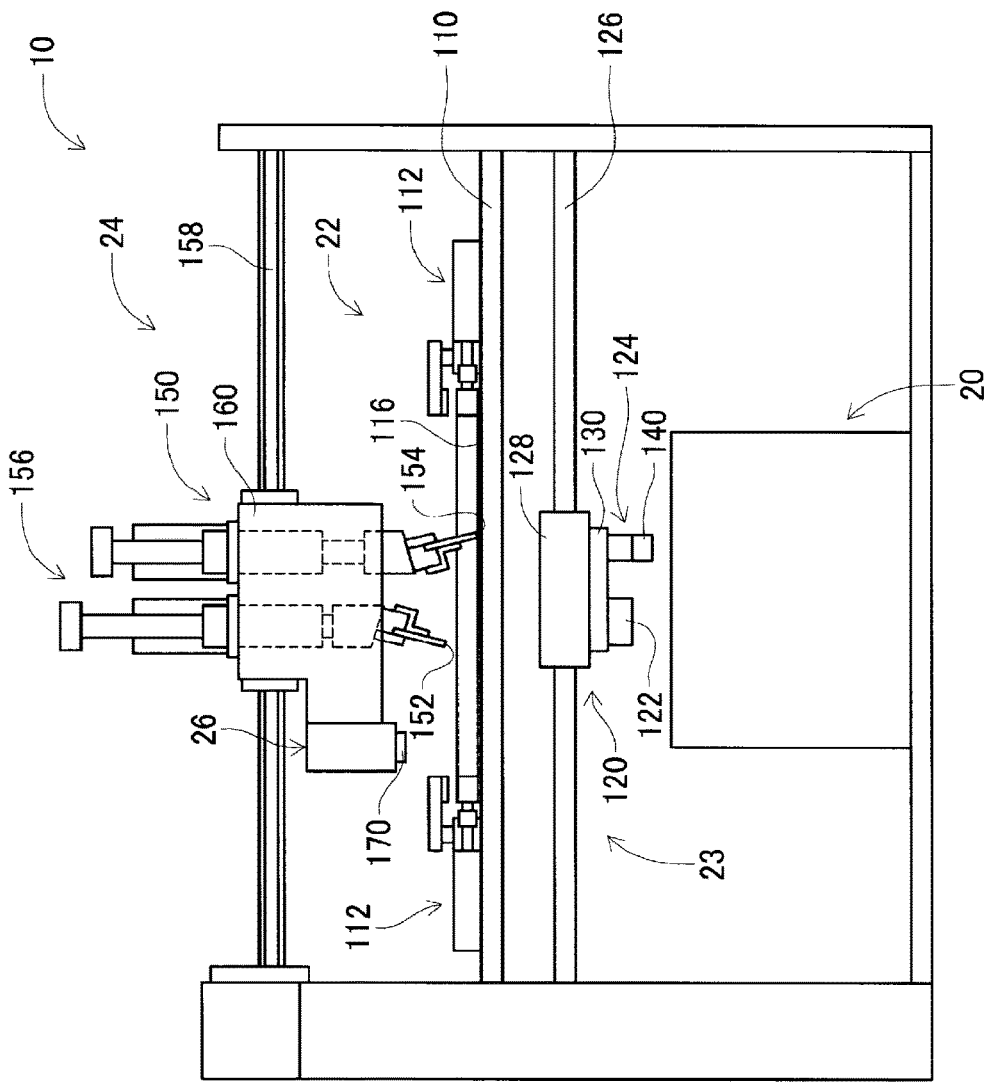
FIG. 1 is a side view illustrating a solder printer.
Figure 2:
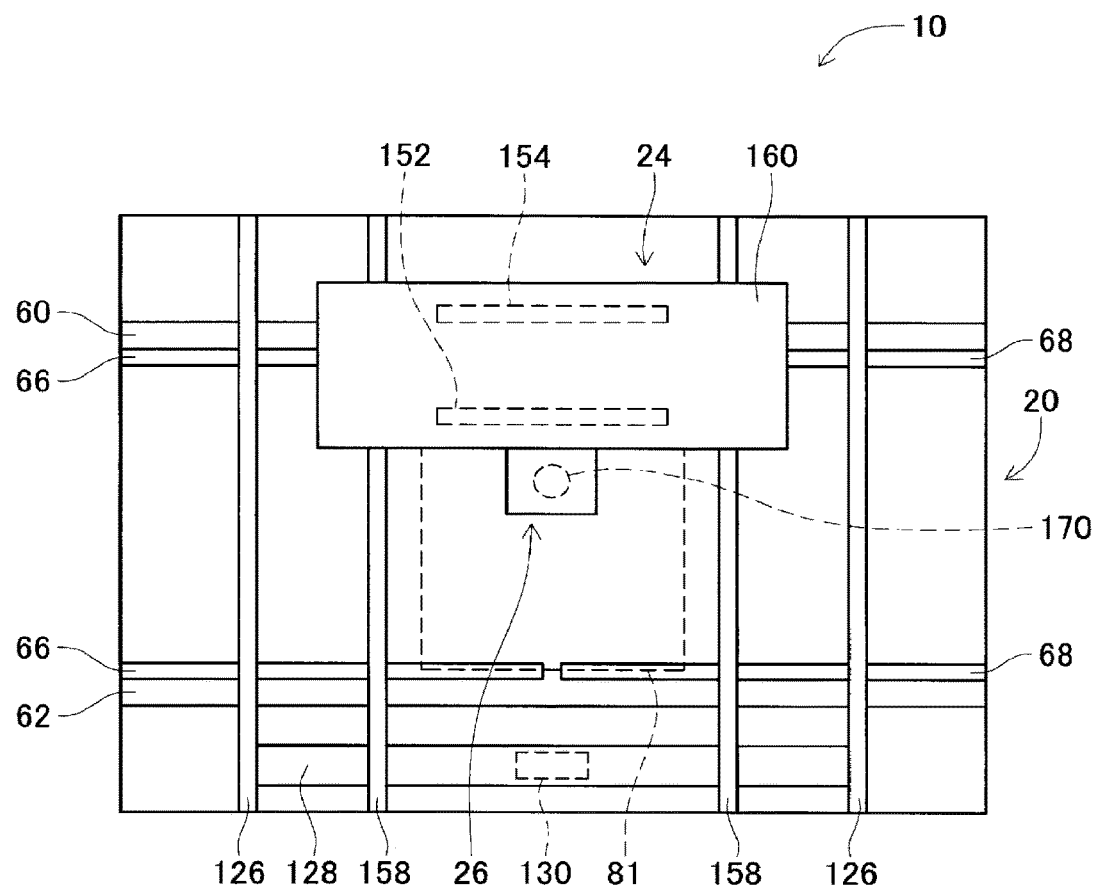
FIG. 2 is a plan view illustrating the solder printer.

Solder printer 10 of the present disclosure is illustrated in FIGS. 1 and 2. Solder printer 10 is a device configured to print cream solder on a circuit substrate. Solder printer 10 includes transfer device 20, mask holding device 22, imaging device 23, squeegee device 24, solder supply device 26, and control device (see FIG. 7) 28. FIG. 1 is a view illustrating solder printer 10 from the side, and FIG. 2 is a view illustrating solder printer 10 from above.

Figure 3:
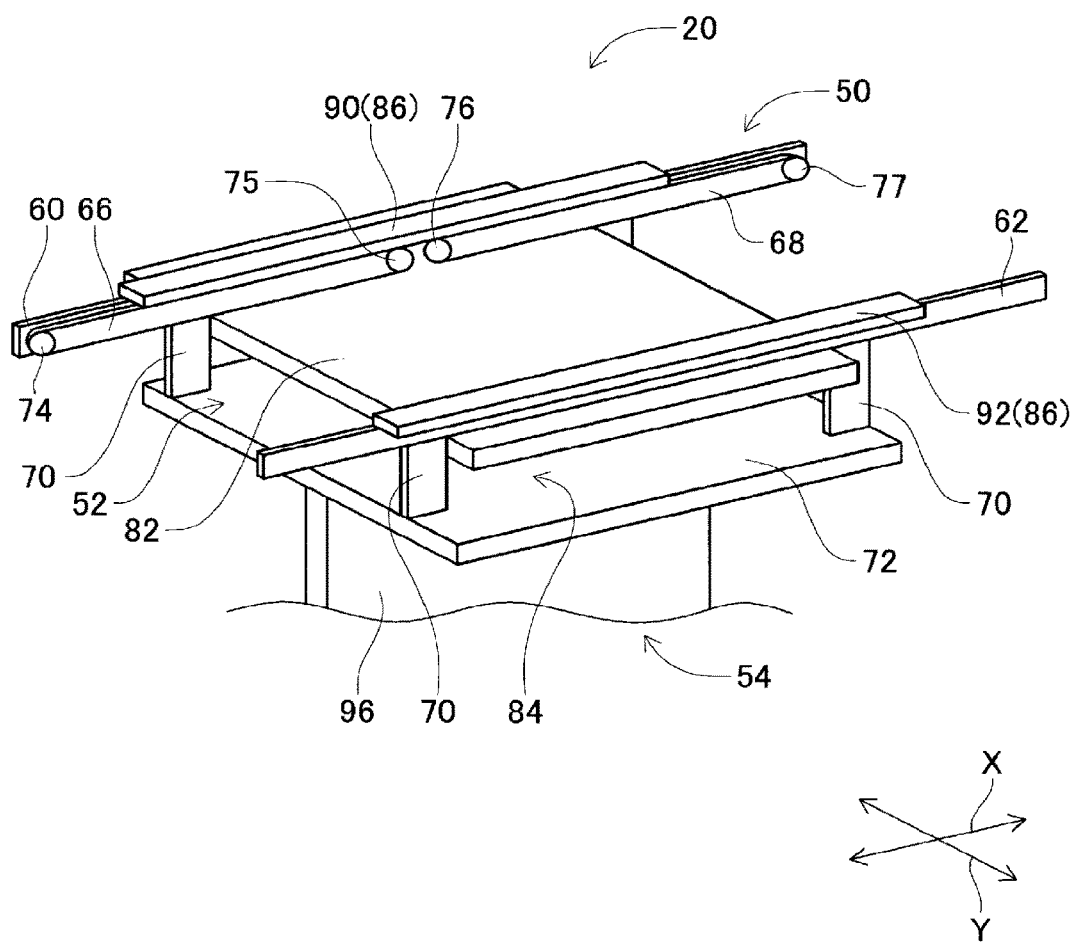
FIG. 3 is a perspective view illustrating a transfer device.
Figure 4:
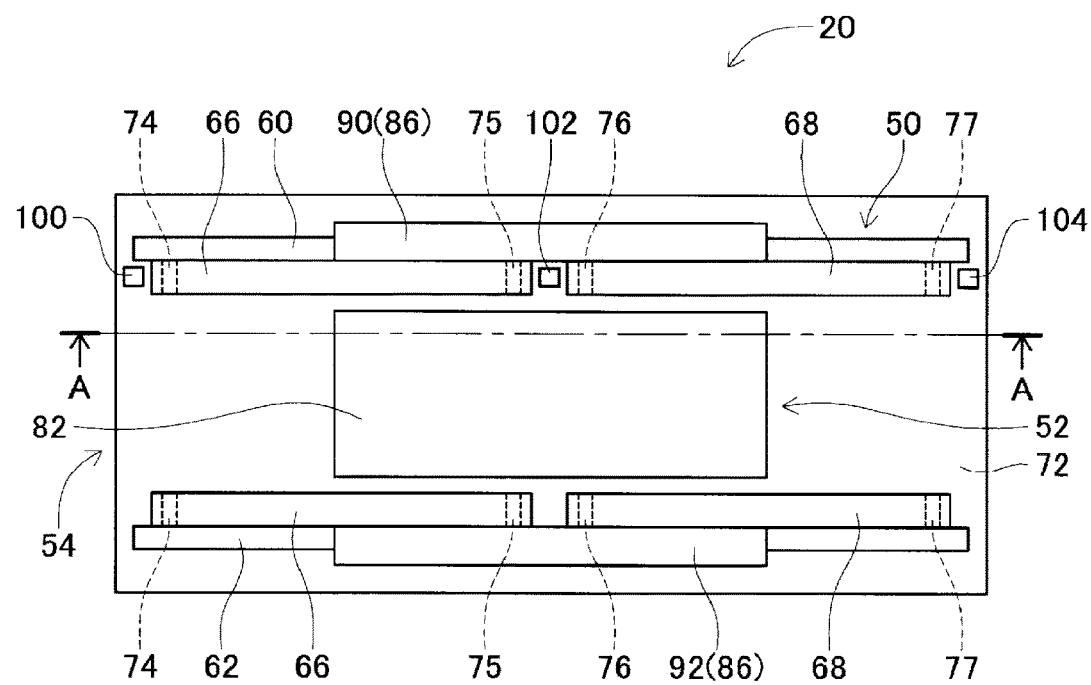
FIG. 4 is a plan view illustrating the transfer device.
Figure 4:
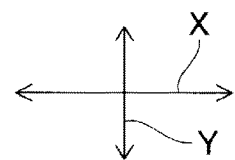
Figure 5:
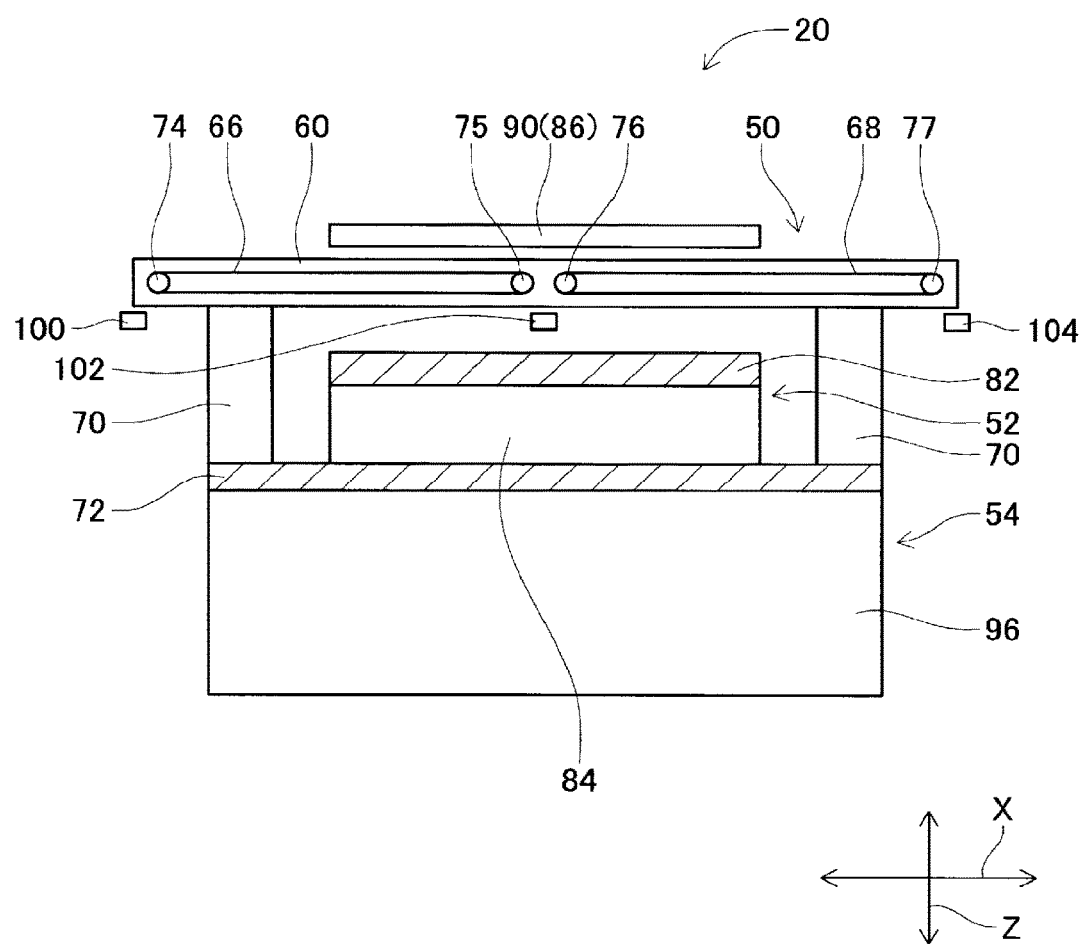
FIG. 5 is a side view taken along line A-A of FIG. 4.

As illustrated in FIGS. 3 to 5, transfer device 20 includes conveyor device 50, substrate holding device 52, and substrate lifting and lowering device 54. FIG. 3 is a view illustrating transfer device 20 from above at an oblique angle, FIG. 4 is a view illustrating transfer device 20 from above, and FIG. 5 is a view illustrating transfer device 20 taken along line A-A of FIG. 4.

Conveyor device 50 includes a pair of guide rails 60 and 62, and first conveyor belt 66 and second conveyor belt 68 which are provided on each of guide rails 60 and 62. The pair of guide rails 60 and 62 are disposed in parallel with each other, and each of guide rails 60 and 62 is supported on an upper face of lifting and lowering base 72 via a pair of support legs 70. The direction in which guide rails 60 and 62 extend is referred to as an X-direction, and the direction horizontally orthogonal to the X-direction is referred to as a Y-direction, and a direction orthogonal to both the X-direction and the Y-direction is referred to as a Z-direction.

Four pulleys 74, 75, 76 and 77 are arranged on side faces of guide rails 60 and 62, the axis of the pulleys being in the Y-direction. Two pulleys 74 and 77 of four pulleys 74, 75, 76, and 77 are disposed at both end portions of guide rails 60 and 62, and remaining two pulleys 75 and 76 are disposed at a center section of each of guide rails 60 and 62 in a state of being slightly spaced apart from each other in the X-direction. Guide rail 60 and guide rail 62 are disposed in a state in which surfaces on which pulleys 74, 75, 76, and 77 are disposed face each other.

First conveyor belt 66 is wound around pulleys 74 and 75 of guide rails 60 and 62, and second conveyor belt 68 is wound around pulleys 76 and 77 of guide rails 60 and 62. First conveyor belt 66 is circulated by driving of electromagnetic motor (see FIG. 7) 78, and second conveyor belt 68 is circulated by driving of electromagnetic motor (see FIG. 7) 80. The circulation direction of each of conveyor belts 66 and 68 is set to a clockwise direction in FIG. 5.

Figure 6:
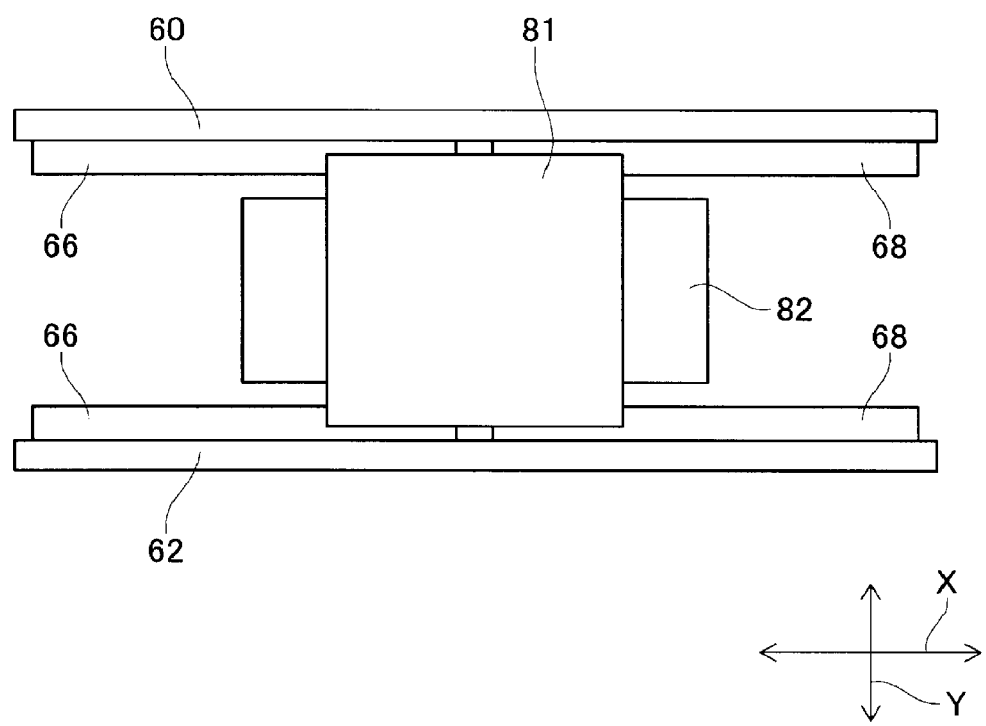
FIG. 6 is a schematic diagram illustrating a circuit substrate conveyed to a work position.

In this way, circuit substrate (see FIG. 6) 81 is placed on first conveyor belt 66 and conveyed toward second conveyor belt 68. Therefore, a side on which first conveyor belt 66 is disposed is referred to as an upstream side, and a side on which second conveyor belt 68 is disposed is referred to as a downstream side. A distance between a downstream end portion of first conveyor belt 66 and an upstream end portion of second conveyor belt 68 is shorter than a length of circuit substrate 81 in the conveyance direction. Therefore, as illustrated in FIG. 6, circuit substrate 81 conveyed from first conveyor belt 66 toward second conveyor belt 68 is conveyed toward second conveyor belt 68 while being supported by both first conveyor belt 66 and second conveyor belt 68. In addition, the circuit substrate moves from first conveyor belt 66 to second conveyor belt 68, and is conveyed to the downstream side by second conveyor belt 68.

As illustrated in FIGS. 3 to 5, substrate holding device 52 includes support table 82, table lifting and lowering mechanism 84, and clamping device 86. Support table 82 has a generally rectangular shape, and is disposed between the pair of guide rails 60 and 62 so that a longitudinal direction thereof coincides with the X-direction. The length of support table 82 in the X-direction is substantially the same as the length of each of conveyor belts 66 and 68 in the X-direction, the upstream end portion of support table 82 substantially coincides with the center section of first conveyor belt 66 in the Y-direction, and the downstream end portion of support table 82 substantially coincides with the center section of second conveyor belt 68 in the Y-direction. The length of support table 82 in the Y-direction is shorter than the distance between conveyor belts 66 and 68 of guide rail 60 and conveyor belts 66 and 68 of guide rail 62, and both edges of support table 82 in the Y-direction do not overlap conveyor belts 66 and 68 of each of guide rails 60 and 62 in the Z-direction.

Support table 82, arranged as described above, is disposed on the upper face of lifting and lowering base 72 via table lifting and lowering mechanism 84. Table lifting and lowering mechanism 84 lifts and lowers support table 82 by being driven by electromagnetic motor 88 illustrated in FIG. 7. Support table 82 is lifted and lowered by table lifting and lowering mechanism 84 between a position where an upper face of support table 82 is positioned below upper faces of conveyor belts 66 and 68 and a position where the upper face of support table 82 is positioned several mm above the upper faces of conveyor belts 66 and 68. As a result, as illustrated in FIG. 6, in a state in which circuit substrate 81 is conveyed at a position where circuit substrate 81 is evenly supported by both first conveyor belt 66 and second conveyor belt 68, that is, a position (hereinafter, referred to as a "work position") where a center of circuit substrate 81 in the X-direction and a gap between first conveyor belt 66 and second conveyor belt 68 substantially coincide with each other in the Y-direction, support table 82 is lifted by table lifting and lowering mechanism 84, whereby circuit substrate 81 is uplifted from the upper faces of conveyor belts 66 and 68. Then, support table 82 is lowered by table lifting and lowering mechanism 84, whereby circuit substrate 81 is placed on the upper faces of conveyor belts 66 and 68.

Clamping device 86 includes fixed clamper 90, movable clamper 92, and air cylinder (see FIG. 7) 94 as illustrated in FIGS. 3 to 5. Fixed clamper 90 and movable clamper 92 have a generally rectangular shape, and the dimension in the longitudinal direction is substantially the same as the length of support table 82 in the X-direction. In addition, fixed clamper 90 is fixed on the upper face of guide rail 60 such that both ends of fixed clamper 90 in the X-direction and both ends of support table 82 in the X-direction coincide with each other in the Y-direction. On the other hand, movable clamper 92 is disposed on the upper face of guide rail 62 such that both ends of movable clamper 92 in the X-direction and both ends of support table 82 in the X-direction coincide with each other in the Y-direction. In other words, fixed clamper 90 and movable clamper 92 are disposed so as to sandwich support table 82 from the upper view.

Movable clamper 92 is slidable in the Y-direction, and is biased by an elastic force of a coil spring (not illustrated) in a direction away from fixed clamper 90. Movable clamper 92 approaches fixed clamper 90 against the elastic force of the coil spring by driving of air cylinder 94. An installation height of fixed clamper 90 and movable clamper 92 is the same as a height at which circuit substrate 81 conveyed to the work position is uplifted from conveyor belts 66 and 68 by table lifting and lowering mechanism 84. Therefore, when circuit substrate 81 is uplifted from conveyor belts 66 and 68 by table lifting and lowering mechanism 84, movable clamper 92 approaches fixed clamper 90 by driving of air cylinder 94, whereby circuit substrate 81 is clamped between fixed clamper 90 and movable clamper 92. As a result, circuit substrate 81 is clamped by clamping device 86 in a state in which circuit substrate 81 is uplifted from conveyor belts 66 and 68.

Substrate lifting and lowering device 54 includes lifting and lowering base 72 and base lifting and lowering mechanism 96. Base lifting and lowering mechanism 96 lifts and lowers lifting and lowering base 72 by driving of electromagnetic motor (see FIG. 7) 98. As a result, conveyor device 50 and substrate holding device 52 disposed on lifting and lowering base 72 are lifted and lowered by substrate lifting and lowering device 54. In other words, circuit substrate 81 in a state of being clamped between clamping device 86 is lifted and lowered by substrate lifting and lowering device 54.

Transfer device 20 includes first sensor 100, second sensor 102, and third sensor 104. First sensor 100 is disposed on the upstream side of first conveyor belt 66 of guide rail 60, and detects circuit substrate 81 conveyed into solder printer 10. Second sensor 102 is disposed between first conveyor belt 66 and second conveyor belt 68 of guide rail 60, and detects circuit substrate 81 to be conveyed from first conveyor belt 66 to second conveyor belt 68 and circuit substrate 81 having moved from first conveyor belt 66 to second conveyor belt 68. Third sensor 104 is disposed on the downstream side of second conveyor belt 68 of guide rail 60, and detects circuit substrate 81 conveyed out from solder printer 10.

As illustrated in FIG. 1, mask holding device 22 includes mask support table 110 disposed above transfer device 20, and mask fixing mechanism 112 disposed on an upper face of mask support table 110. An opening section (not illustrated) is formed in a center section of mask support table 110, and mask 116 is placed on mask support table 110 so as to cover the opening. Mask 116 placed on mask support table 110 is securely held by mask fixing mechanism 112.

The opening section formed in mask support table 110 is larger than circuit substrate 81 transported by transfer device 20, and circuit substrate 81 clamped by clamping device 86 is lifted by substrate lifting and lowering device 54 so that circuit substrate 81 is tightly attached to a lower face of mask 116 held by mask fixing mechanism 112, and then circuit substrate 81 is lowered by substrate lifting and lowering device 54 so that circuit substrate 81 is away from the lower face of mask 116.

As illustrated in FIGS. 1 and 2, imaging device 23 includes camera moving device 120, camera 122, and stopper 124. Camera moving device 120 includes a pair of slide rails 126, Y-slider 128, and X-slider 130. The pair of slide rails 126 is disposed between transfer device 20 and mask holding device 22 so as to extend in parallel with each other in the Y-axis direction. Y-slider 128 is slidably held by the pair of slide rails 126 and slides in the Y-direction by operation of electromagnetic motor (see FIG. 7) 132. X-slider 130 is slidably mounted on a lower face side of Y-slider 128 in the X-direction and slides in the X-direction by operation of electromagnetic motor (see FIG. 7) 136. Slide rail 126 does not overlap substrate lifting and lowering device 54 of transfer device 20 in a vertical direction, and Y-slider 128 moves above substrate lifting and lowering device 54, so that circuit substrate 81 is lifted by substrate lifting and lowering device 54 without coming into contact with imaging device 23.

Camera 122 is attached to a lower face side of X-slider 130 in a state of facing downward. Stopper 124 is generally rod-shaped and is attached to the lower face side of X-slider 130 in a state of extending downward. Thus, camera 122 and stopper 124 can be moved to any position above transfer device 20. Stopper 124 has stopper lifting and lowering device (see FIG. 7) 138, and can be lowered from X-slider 130 or lifted toward X-slider 130. Contact sensor 140 is disposed on the distal end of stopper 124, and contact sensor 140 detects contact of another member with the distal end of stopper 124.

Squeegee device 24 includes squeegee moving device 150, a pair of squeegees 152 and 154, and squeegee lifting and lowering device 156. Squeegee moving device 150 includes a pair of slide rails 158 and slider 160. The pair of slide rails 158 is disposed above mask holding device 22 so as to extend in parallel with each other in the Y-axis direction. Slider 160 is slidably mounted on the pair of slide rails 158 and slides in the Y-direction by operation of electromagnetic motor (see FIG. 7) 162. Each of the pair of squeegees 152 and 154 has a generally rectangular plate shape and is formed of a flexible material. The pair of squeegees 152 and 154 is disposed so as to face each other and extend in the X-axis direction, and are held by squeegee lifting and lowering device 156 below slider 160. Squeegee lifting and lowering device 156 individually lifts and lowers the pair of squeegees 152 and 154.

Solder supply device 26 is a device for supplying cream solder, and discharging port 170 for discharging cream solder is formed on a lower face of solder supply device 26. Solder supply device 26 is fixed to a substantially center section of a side face of slider 160 in the Y-axis direction. As a result, solder supply device 26 is moved to an arbitrary position in the Y-axis direction by operation of squeegee moving device 150.

Figure 7:
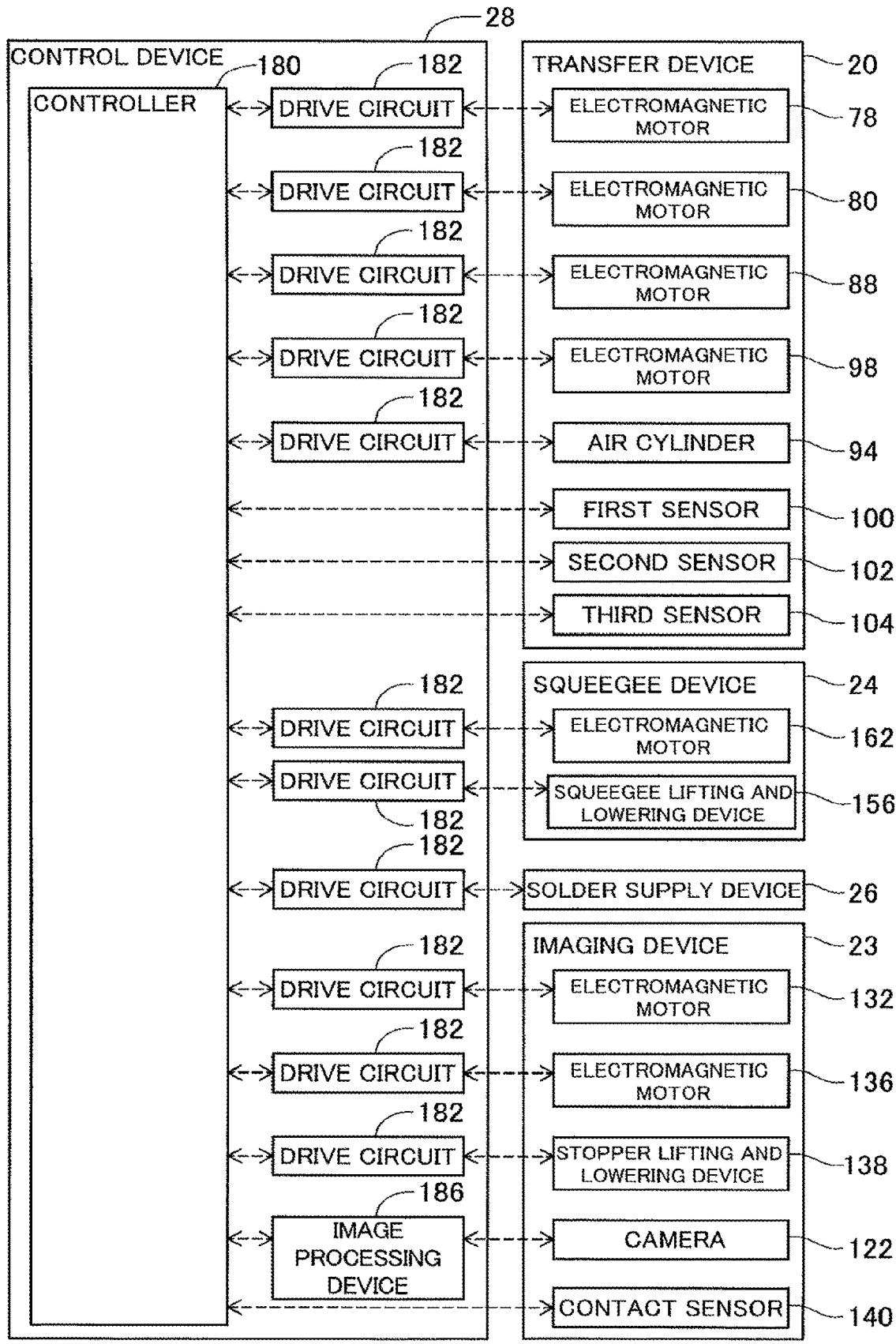
FIG. 7 is a block diagram illustrating a control device.

As illustrated in FIG. 7, control device 28 includes controller 180, multiple drive circuits 182, and image processing device 186. Multiple drive circuits 182 are connected to electromagnetic motors 78, 80, 88, 98, 132, 136, 162, air cylinder 94, stopper lifting and lowering device 138, squeegee lifting and lowering device 156, and solder supply device 26. Controller 180 includes CPU, ROM, RAM, and the like, and is mainly configured as a computer, and is connected to multiple drive circuits 182. As a result, the operation of transfer device 20, squeegee device 24, and the like is controlled by controller 180. Controller 180 is also connected to image processing device 186. Image processing device 186 is configured to process image data obtained by camera 122, and controller 180 acquires various types of information from the image data. Furthermore, controller 180 is also connected to first sensor 100, second sensor 102, third sensor 104, and contact sensor 140, and acquires detection values from the respective sensors.

(B) Operation of Solder Printer

In solder printer 10, by the above-described configuration, circuit substrate 81 is conveyed to the work position and clamped between clamping device 86. Subsequently, clamped circuit substrate 81 is lifted by substrate lifting and lowering device 54 to adhere to the lower face of mask 116. Through-holes (not illustrated) are formed in mask 116 in accordance with patterns of pads and the like of circuit substrate 81. Then, cream solder is applied to mask 116, whereby the cream solder is printed on circuit substrate 81 through the through-holes of mask 116.

More specifically, circuit substrate 81 is conveyed into solder printer 10 and conveyed by first conveyor belt 66. The downstream end portion of circuit substrate 81 moves to the upstream end portion of second conveyor belt 68. At this time, circuit substrate 81 is conveyed toward the downstream side in a state of being supported by both first conveyor belt 66 and second conveyor belt 68. Before the circuit substrate is conveyed to second conveyor belt 68, in imaging device 23, X-slider 130 is moved above second conveyor belt 68 by camera moving device 120, and stopper 124 attached to X-slider 130 is lowered. At this time, stopper 124 is lowered until the distal end thereof is positioned below the upper face of second conveyor belt 68.

As a result, circuit substrate 81 conveyed by both first conveyor belt 66 and second conveyor belt 68 comes into contact with the distal end portion of stopper 124, and a detection signal is transmitted to controller 180 from contact sensor 140. When receiving the detection signal from contact sensor 140, controller 180 stops the operation of first conveyor belt 66 and second conveyor belt 68, and thereby circuit substrate 81 stops at a position where circuit substrate 81 abuts on stopper 124. A lowered position of stopper 124 is a center section in the X-direction of second conveyor belt 68, and circuit substrate 81 abutting on stopper 124 at that position stops at the work position. In other words, circuit substrate 81 conveyed by both first conveyor belt 66 and second conveyor belt 68 is blocked at the work position by stopper 124, and the operation of both first conveyor belt 66 and second conveyor belt 68 is stopped by coming into contact with stopper 124, whereby circuit substrate 81 stops at the work position.

When circuit substrate 81 stops at the work position, stopper 124 is lifted. Subsequently, in transfer device 20, support table 82 is lifted, circuit substrate 81 is uplifted from conveyor belts 66 and 68, and is clamped by clamping device 86. Furthermore, when circuit substrate 81 is clamped by clamping device 86, circuit substrate 81 clamped by clamping device 86 is imaged by camera 122 attached to X-slider 130. Then, the stopping position of circuit substrate 81, the type of circuit substrate 81, and the like are analyzed by controller 180 based on the imaging data. Thereafter, lifting and lowering base 72 is lifted by substrate lifting and lowering device 54. As a result, circuit substrate 81 clamped by clamping device 86 is lifted together with lifting and lowering base 72, and comes into close contact with the lower face of mask 116.

Next, cream solder is supplied to the upper face of mask 116 by solder supply device 26. Next, one of the pair of squeegees 152 and 154 is lowered by squeegee lifting and lowering device 156, and the distal end of the lowered squeegee comes into contact with the upper face of mask 116. Then, the squeegee is moved in the Y-direction by squeegee moving device 150, whereby the cream solder is scraped off by the squeegee. At this time, the cream solder is filled in the through-holes of mask 116 and printed on circuit substrate 81. Thus, the printing work on circuit substrate 81 is completed.

Subsequently, when the printing work on circuit substrate 81 is completed, lifting and lowering base 72 is lowered, and circuit substrate 81 is lowered together with lifting and lowering base 72, whereby adhesion to the lower face of mask 116 is released. In addition, the clamping of circuit substrate 81 by clamping device 86 is released during lowering of lifting and lowering base 72 or at a timing at which lowering of lifting and lowering base 72 starts, and support table 82 is lowered. As a result, circuit substrate 81 in which the clamping is released is lowered toward first conveyor belt 66 and second conveyor belt 68. While lifting and lowering base 72 and support table 82 are lowered, the operation of both conveyor belts 66 and 68 of first conveyor belt 66 and second conveyor belt 68 starts. In other words, conveyor device 50 is lowered by the lowering of lifting and lowering base 72, and the operation of both conveyor belts 66 and 68 of first conveyor belt 66 and second conveyor belt 68 is started in conveyor device 50 while the circuit substrate is lowered toward first conveyor belt 66 and second conveyor belt 68 by lowering of support table 82. Therefore, circuit substrate 81 supported by support table 82 is placed on first conveyor belt 66 and second conveyor belt 68, and at the same time, is conveyed toward the downstream side, and circuit substrate 81 is conveyed toward the downstream side while transfer device 20 is being lowered. In this way, it possible to shorten the cycle time.

Figure 8:
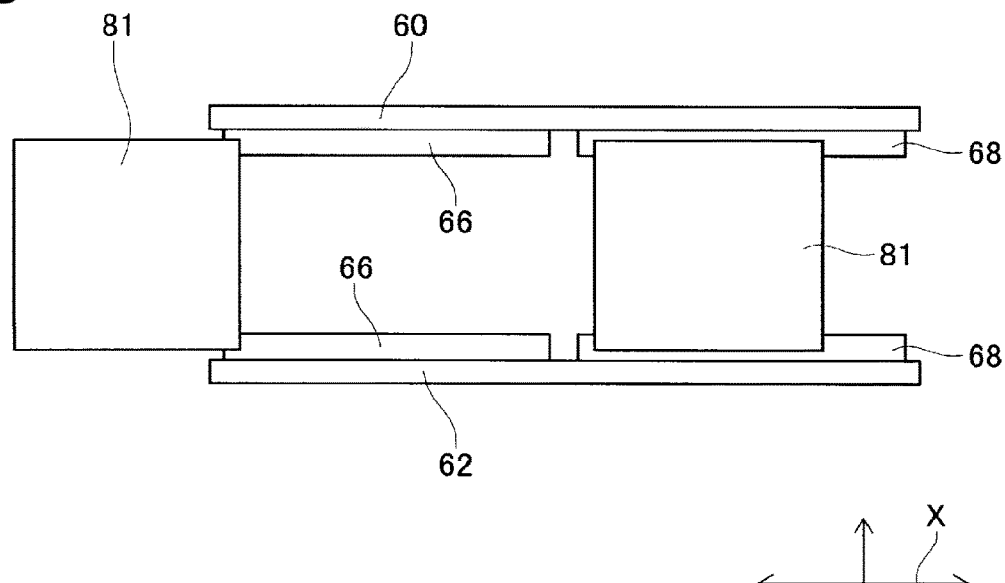

Subsequently, when circuit substrate 81 is conveyed from the work position toward the downstream side, as illustrated in FIG. 8, circuit substrate 81 moves from first conveyor belt 66 to second conveyor belt 68. At this time, the moving of circuit substrate 81 from first conveyor belt 66 toward second conveyor belt 68 is detected by second sensor 102, and the detected signal is transmitted to controller 180 from second sensor 102. Upon receiving the detected signal, controller 180 causes a new circuit substrate 81 to be conveyed into transfer device 20. As a result, circuit substrate 81 on which the printing work has been completed is conveyed by second conveyor belt 68, and a new circuit substrate 81 is conveyed by first conveyor belt 66.

Figure 9:
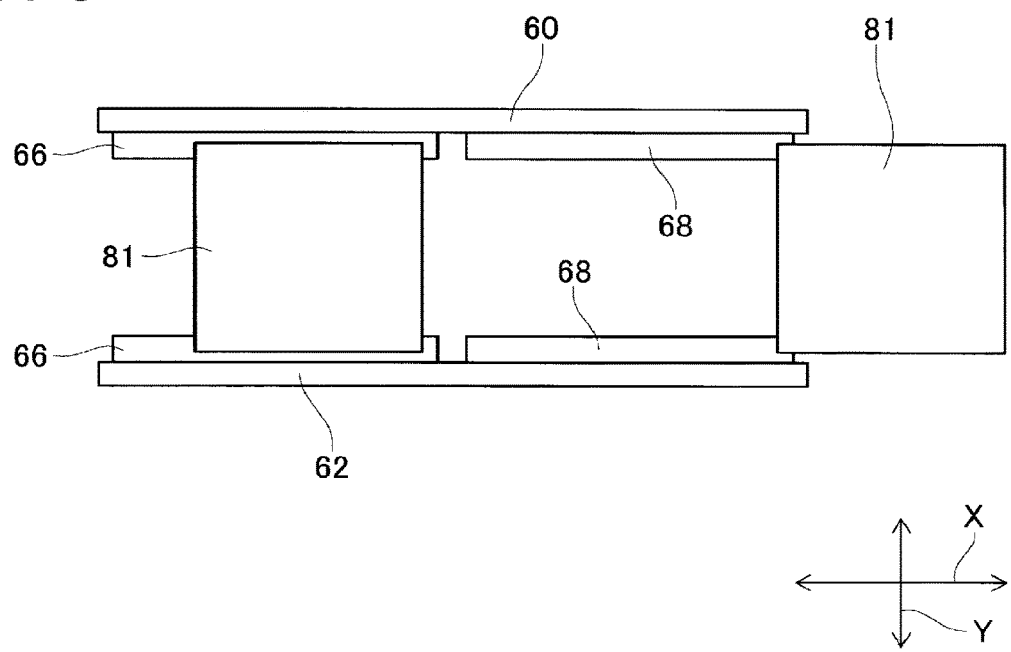
FIG. 9 is a schematic diagram illustrating a circuit substrate being conveyed out and a circuit substrate being conveyed to just before the work position.

Then, two circuit substrates 81 are further conveyed, so that circuit substrate 81 on which the printing work has been completed is conveyed out from transfer device 20 by second conveyor belt 68, and a new circuit substrate 81 is conveyed to just before the work position by first conveyor belt 66, as illustrated in FIG. 9. In other words, in transfer device 20, when circuit substrate 81 on which the printing work has been completed is conveyed out, a new circuit substrate 81 is conveyed into transfer device 20 and conveyed to just before the work position. As a result, it is possible to perform the printing work on the new circuit substrate 81 at an early stage, and it is possible to shorten the cycle time.

Figure 10:
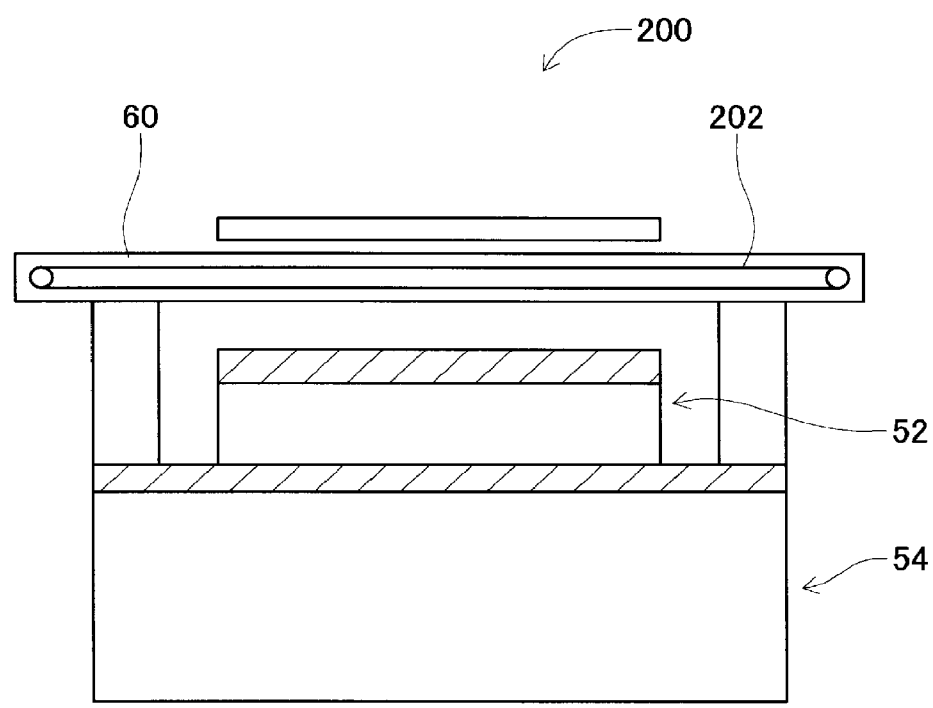
FIG. 10 is a side view illustrating a conventional transfer device.
Figure 10:
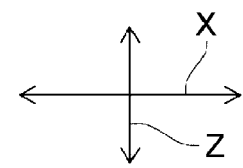

As described above, in solder printer 10, by employing transfer device 20 including first conveyor belt 66 and second conveyor belt 68, it is possible to shorten the cycle time, to downsize the transfer device, to simplify the structure of the transfer device, and the like. More specifically, as illustrated in FIG. 10, in conventional transfer device 200, two conveyor belts, that is, first conveyor belt 66 and second conveyor belt 68, are not disposed on each of guide rails 60 and 62, but only one conveyor belt 202 is disposed thereon. Except for conveyor belt 202, constituent elements of transfer device 200 are the same as those of transfer device 20 included in solder printer 10, and outer dimensions of transfer device 200 is the same as those of transfer device 20. For this reason, explanations of the same constituent elements as those of transfer device 20 are not repeated, and the same reference numerals are used.

Since only one conveyor belt 202 is disposed in transfer device 200 having such a structure, a new circuit substrate 81 cannot be conveyed into transfer device 200 until circuit substrate 81 on which the printing work has been completed is conveyed out from transfer device 200. In other words, in transfer device 200, when circuit substrate 81 on which the printing work has been completed is conveyed out from transfer device 200, a new circuit substrate 81 cannot be conveyed into transfer device 200 and conveyed to the front of the work position as in transfer device 20. For this reason, in a case where transfer device 200 is used, the printing work on the new circuit substrate 81 cannot be performed at an early stage, and therefore the cycle time cannot be shortened.

Figure 11:
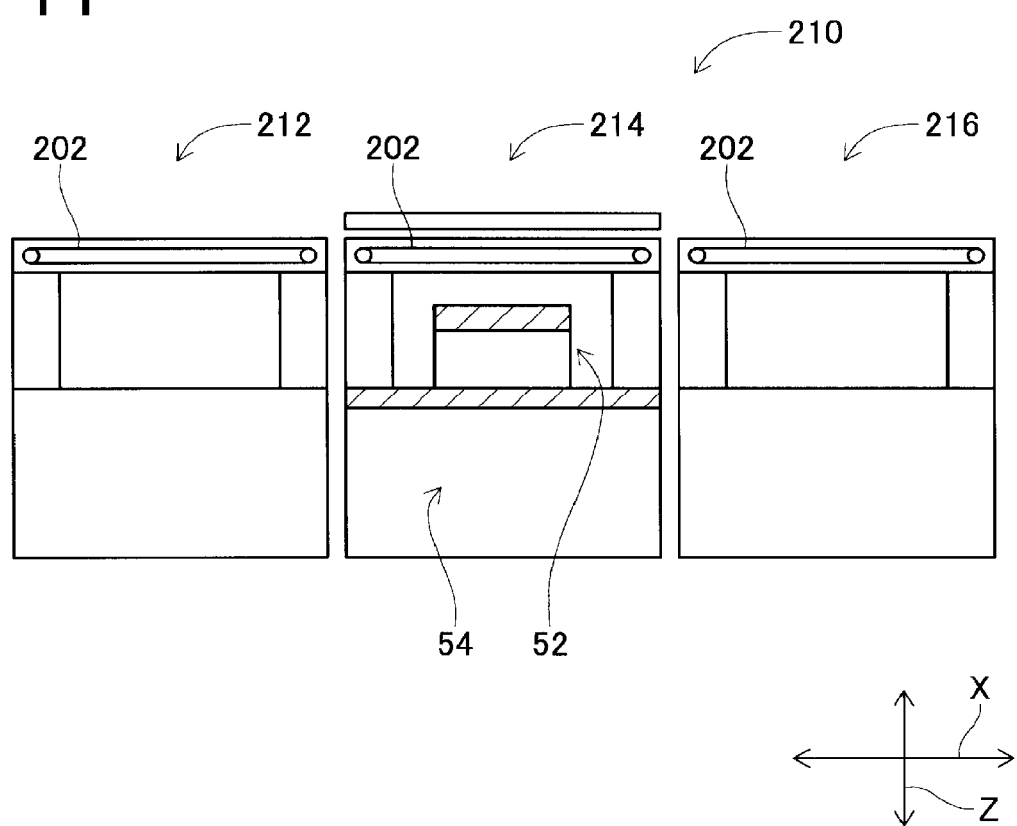
FIG. 11 is a side view illustrating a conventional transfer system.

Transfer system 210 illustrated in FIG. 11 is also conventional art. Transfer system 210 is configured of three transfer devices 212, 214, and 216, and three transfer devices 212, 214, and 216 are arranged side by side in the X-direction. Transfer device 214 is the same as transfer device 200, except for dimensions thereof. Therefore, description of transfer device 214 is not repeated, and the same reference numerals as those of transfer device 200 are used for the same constituent elements. A dimension of transfer device 214 in the X-direction is set such that conveyor belt 202 of transfer device 214 and conveyor belts 66 and 68 of transfer device 20 have the same length. In other words, the size of transfer device 214 is about half that of transfer device 20 in the X-direction. Transfer device 212 and transfer device 216 have the same structure, and are devices excluding substrate holding device 52 and substrate lifting and lowering device 54 from transfer device 214. Therefore, descriptions of transfer device 212 and transfer device 216 are not repeated, and the same reference numerals as those of transfer device 214 are used for the same constituent elements.

In transfer system 210 having such a structure, printing work is performed on circuit substrate 81 in transfer device 214. Therefore, it is possible to convey a new circuit substrate 81 into transfer device 212 while the printing work is being performed by transfer device 214. The size of transfer device 214 is about half that of transfer device 20 in the X-direction. In other words, in transfer system 210, when the printing work is completed in transfer device 214 and circuit substrate 81 is conveyed out from transfer device 214, it is possible to convey a new circuit substrate 81 into just before the work position of transfer device 214. Therefore, in transfer system 210, it is possible to perform the printing work on the new circuit substrate 81 at an early stage, and it is possible to shorten the cycle time similarly to transfer device 20.

However, the length of transfer device 20 in the X-direction is about twice the length of conveyor belt 66, while the length of transfer system 210 in the X-direction is about three times the length of conveyor belt 202. In addition, the length of conveyor belt 66 and the length of conveyor belt 202 are the same. Therefore, the length of transfer system 210 in the X-direction is 1.5 times the length of transfer device 20 in the X-direction. In addition, since transfer system 210 is configured by three transfer devices 212, 214, and 216, the structure thereof is complicated. In other words, in a case where transfer system 210 is employed, the cycle time can be shortened, but the downsizing and the simplification of structure cannot be achieved.

As described above, in solder printer 10, by employing transfer device 20 including first conveyor belt 66 and second conveyor belt 68, it is possible to shorten the cycle time, to downsize the transfer device, to simplify the structure of the transfer device, and the like as compared with conventional transfer device 200 and transfer system 210.

Transfer device 20 is an example of a substrate transfer device. Substrate holding device 52 is an example of a holding device. Substrate lifting and lowering device 54 is an example of a lifting and lowering device. Guide rails 60 and 62 are an example of a guide mechanism and a guide rail. First conveyor belt 66 is an example of a first conveyor belt. Second conveyor belt 68 is an example of a second conveyor belt.

In addition, the present disclosure is not limited to the above-described embodiments, and can be implemented in various modes in which various changes and improvements are made based on the knowledge of a person skilled in the art. Specifically, for example, in the above embodiments, transfer device 20 of the present disclosure is used in solder printer 10, but it is possible to use transfer device 20 of the present disclosure in various working machines such as a component mounter, an inspector, and an assembly work machine.

In the above embodiments, first conveyor belt 66 and second conveyor belt 68 are disposed on one guide rail 60 and one guide rail 62; but for example, one guide rail may be divided into two guide rails; first conveyor belt 66 may be disposed on one of the divided two guide rails; and second conveyor belt 68 may be disposed on the other.

REFERENCE SIGNS LIST

20: transfer device (substrate transfer device)
52: substrate holding device (holding device)
54: substrate lifting and lowering device (lifting and lowering device)
60: guide rail (guide mechanism)
62: guide rail (guide mechanism)
66: first conveyor belt (first conveyor belt)
68: second conveyor belt (second conveyor belt)

The invention claimed is:

1. A substrate transfer device, comprising:
a pair of guide mechanisms disposed in a state of being spaced apart from each other so as to extend in a substrate conveyance direction;
a first conveyor belt disposed on each of the pair of guide mechanisms at an upstream side in the substrate conveyance direction and configured to convey a substrate to a downstream side in the substrate conveyance direction;
a second conveyor belt disposed on each of the pair of guide mechanisms at the downstream side in the substrate conveyance direction and configured to convey the substrate conveyed by the first conveyor belt further to the downstream side;
a holding device configured to hold the substrate supported by both the first conveyor belt and the second conveyor belt; and
a lifting and lowering device configured to lift and lower the pair of guide mechanisms, the first conveyor belt, the second conveyor belt, and the holding device integrally, wherein
a distance between a downstream end of the first conveyor belt and an upstream end of the second conveyor belt is shorter than a substrate length in the substrate conveyance direction, and
work is performed on the substrate held by the holding device.

2. The substrate transfer device according to claim 1, wherein each of the pair of guide mechanisms has one guide rail, and the first conveyor belt and the second conveyor belt are disposed on the one guide rail.

3. The substrate transfer device according to claim 1,
wherein work is performed on the substrate held by the holding device in a state in which the pair of guide mechanisms, the first conveyor belt, the second conveyor belt, and the holding device are integrally lifted by the lifting and lowering device, and
after the substrate held by the holding device is released, the first conveyor belt and the second conveyor belt start an operation while the pair of guide mechanisms, the first conveyor belt, the second conveyor belt, and the holding device are integrally lowered by the lifting and lowering device.

4. The substrate transfer device according to claim 1,
wherein the holding device holds the substrate lifted from the first conveyor belt and the second conveyor belt, and
while the substrate released from the holding device is lowered toward the first conveyor belt and the second conveyor belt, the first conveyor belt and the second conveyor belt start an operation.

* * * * *